United States Patent
Distefano et al.

[11] Patent Number: 5,834,339
[45] Date of Patent: Nov. 10, 1998

[54] METHODS FOR PROVIDING VOID-FREE LAYERS FOR SEMICONDUCTOR ASSEMBLIES

[75] Inventors: Thomas H. Distefano, Monte Sereno; Joseph Fjelstad, Sunnyvale, both of Calif.

[73] Assignee: Tessera, Inc., San Jose, Calif.

[21] Appl. No.: 610,610

[22] Filed: Mar. 7, 1996

[51] Int. Cl.$^6$ ................................................. H01L 21/44
[52] U.S. Cl. ............................................ 438/125; 438/118
[58] Field of Search ................................. 438/118, 124, 438/125, 126, 127

[56] References Cited

U.S. PATENT DOCUMENTS

| | | |
|---|---|---|
| 5,120,678 | 6/1992 | Moore et al. . |
| 5,148,265 | 9/1992 | Khandros et al. . |
| 5,148,266 | 9/1992 | Khandros et al. . |
| 5,194,930 | 3/1993 | Papathomas et al. . |
| 5,203,076 | 4/1993 | Banerji et al. . |
| 5,249,101 | 9/1993 | Frey et al. . |
| 5,288,944 | 2/1994 | Bronson et al. .......................... 438/126 |
| 5,289,346 | 2/1994 | Carey et al. ............................. 438/127 |
| 5,385,869 | 1/1995 | Liu et al. ................................ 438/126 |

*Primary Examiner*—Kevin Picardat
*Attorney, Agent, or Firm*—Lerner, David, Littenberg, Krumholz & Mentlik

[57] ABSTRACT

A method for the removal of voids and gas bubbles within uncured or partially cured microelectronic component encapsulants and adhesive/chip attach layers. A sealed void or gas bubble within a gap between a microelectronic component and a supporting substrate is substantially eliminated through the application of a uniform pressure (isostatic or hydrostatic) and energy such that a substantially void/bubble free interposer layer is created.

93 Claims, 8 Drawing Sheets

METHODS FOR PROVIDING VOID-FREE LAYERS FOR SEMICONDUCTOR ASSEMBLIES

FIELD OF THE INVENTION

The present invention relates to the field of semiconductor chip packaging.

BACKGROUND OF THE INVENTION

In the construction of semiconductor chip assemblies, it has been found desirable to interpose encapsulating material between and/or around elements of the semiconductor assemblies in an effort to reduce and/or redistribute the strain and strain on the connections between the semiconductor chip and a supporting circuitized substrate during operation of the chip, and to seal the elements against corrosion.

Ball grid array ("BGA") packaged and chip scale packaged ("CSP") semiconductor chips and flip chip attachment solutions are connected to external circuitry through contacts on a surface of the chip. To save area on a supporting substrate, such as a printed wiring board ("PWB"), these chips are directly connected/soldered to the substrates and from there connected to external circuitry on other parts of the substrate. The chip contacts are either disposed in regular grid array patterns, substantially covering the face surface of the chip (commonly referred to as an "area array") or in elongated rows extending parallel to and adjacent each edge of the chip front surface. Many of the techniques for attachment run into problems because of the thermal expansion mismatch between the material the chip is composed of and the material the supporting circuitized substrate is made of, such as a PWB. In other words, when the chip is in operation, the chip heats up and also heats its supporting substrate thereby causing both the chip and the substrate to expand. When the heat is removed, the chip and substrate both contract. This heating and cooling process is referred to as "thermal cycling". Since the heat is being generated in the chip, the chip will heat up more quickly and will typically get hotter than its supporting substrate. The materials comprising both the chip and the substrate have inherent expansion and contraction rates, referred to as their coefficients of thermal expansion ("CTE"), which causes them to expand and contract at different rates and in different degrees when subjected to the same thermal conditions. This thermal expansion mismatch between the chips and the substrate places considerable mechanical stress and strain on the connections between the chip contacts and corresponding bond pads on the substrate.

BGA and CSP technology refers to a large range of semiconductor packages which use interconnection processes such as wirebonding, beam lead, tape automated bonding ("TAB") or the like as an intermediate connection step to interconnect the chip contacts to the exposed package terminals. This results in a device which can be tested prior to mechanical attachment to the bond pads on supporting substrate. The BGA or CSP packaged chips are then typically interconnected with their supporting substrates using standard tin-lead solder connections. In most such packaged devices, the mechanical stress/strain due to thermal cycling is almost completely placed on the solder connections between the chip and the substrate. However, solder was never intended to undergo such forces and commonly undergoes significant elastic solder deformation causing the solder to crack due to fatigue brought on by the thermal cycling. When the solder connections have smaller diameters, thermal cycling has an even more profound fatiguing affect on the solder. This has driven efforts in the packaging art to modify the solder and other elements of the packages so that they may better withstand the thermal cycling forces.

As the features of semiconductor chip packages continue to be reduced in size, as in the case of CSPs, the number of chips packed into a given area will be greater and thus the heat dissipated by the each of these chips will have a greater effect on the thermal mismatch problem. Further, the solder cracking problem is exacerbated when more than one semiconductor chip is mounted in a package, such as in a multichip module. As more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing the overall rigidity of the connection between the module and its supporting substrate.

Certain designs have reduced solder connection fatigue by redistributing the thermal cycling stress into a portion of the chip package itself. An example of such a design is shown in U.S. Pat. Nos. 5,148,265 and 5,148,266, the disclosure of which is incorporated herein by reference. One disclosed embodiment of these patents shows the use of a chip carrier in combination with a compliant layer to reduce the CTE mismatch problems. Typically, the compliant layer includes an elastomeric layer which, in the finished package, is disposed between the chip carrier and the face surface of the chip. The compliant layer provides resiliency to the individual terminals, allowing each terminal to move in relation to its electrically connected chip contact to accommodate CTE mismatch as necessary during testing, final assembly and thermal cycling of the device.

In some arrangements used heretofore, the compliant layer was formed by stenciling a thermoset resin onto the chip carrier and then curing the resin. Next, additional resin was applied to the exposed surface of the cured layer, this additional resin was partially cured, and the resulting tacky adhesive surface was used to bond the elastomeric layer to the chip and chip carrier. Once attached, the entire structure was heated and fully cured. Although this process is effective, further improvement would be desirable. The ambient gas can be occasionally entrapped when the chip carrier and die are affixed to the compliant layer. The entrapped gas can create voids and gas bubbles in the encapsulation of the surface of the die by the encapsulation material. These voids/bubbles allow moisture and other contamination to come into direct contact with the surface of the die. Accordingly, care must be taken to prevent such entrapment. This adds to the expense of the process.

In the flip-chip mounting technique, the contact bearing face surface of the chip opposes a bond pad bearing supporting substrate. Each contact on the device is joined by a solder connection to a corresponding bond pad on the supporting substrate, as by positioning solder balls on the substrate or device, juxtaposing the device with the substrate in the front-face-down orientation and momentarily reflowing the solder. The flip-chip technique yields a compact assembly, which occupies an area of the substrate no larger than the area of the chip itself. However, flip-chip assemblies suffer from significant problems when encountering thermal cycling stress because the sole thermal cycling stress bearing elements are the solder connections, as described above in relation to the BGA and CSP packages. In the case of flip chip devices, there is no package to redistribute the thermal cycling stress. Because of this, significant work has been done in the art to make the flip chip solder connections more reliable. However, to keep the chip's standoff from the substrate to a minimum, the solder connections have a typical diameter of between about five and eight thousandths of an inch ("mils"), too small to provide much real mechanical compliance. In an attempt to solve this problem, a curable liquid underfill is flowed between the chip and its attached substrate, enclosing the solder connections. The underfill is then cured into a rigid form which has a CTE that is closely matched to the solder material. The aim of the underfill is to reduce the stress caused by CTE mismatch by redistributing the stress more uniformly over the entire surface of the chip, supporting substrate and solder balls. Examples of the use of underfill materials may be found in U.S. Pat. Nos. 5,120,678, 5,194,930, 5,203,076 and 5,249,101. All of these prior art solutions are aimed at reducing the shear stress endured by the interconnections caused by thermal cycling. However, each of these solutions also encounters significant problems such as insufficient compliancy, voids and process cost. Most significant among these costs is reducing the voiding problem which occurs when the underfill flows between the chip and the substrate and traps gas therebetween. If this gas is not removed, it will typically quickly expand during a heating cycle of the chip. The force associated with the expanding gas can cause the solder connections to crack or otherwise become unreliable. Yet, presently, the underfill process involves a very costly and time-consuming process of allowing the underfill to flow very slowly between the chip and the substrate to try to avoid voids. After the underfill has flowed completely between the chip and the substrate, the assembly will then be subjected to one or more vacuuming steps in a further attempt to remove any voids in the underfill material.

Despite these and other efforts in the art, still further improvements in interconnection technology would be desirable.

SUMMARY OF THE INVENTION

The present invention provides a method of eliminating voids and gas bubbles within the encapsulation used in attaching and packaging microelectronic devices which solves the aforementioned problems in the art. The present invention further provides an effective method of filling cavities and channels during encapsulation of a semiconductor chip.

In one embodiment, the method includes providing a substantially void and bubble free underfill for a flip chip assembly. Typically, a flip chip device is electrically and mechanically attached to a circuitized substrate, such as a PWB, by a plurality of conductive members, which are most typically a plurality of solder balls. These solder balls provide an electrical path from each chip contact to a respective bond pad on the substrate. The solder balls further provide a gap or stand-off between the flip chip device and its substrate. This gap is then sealed on all sides with a curable liquid encapsulant so that either a void (vacuum) or an area containing a first gas is thereby created. An isostatic or hydrostatic pressure is then applied to the assembly of elements causing the encapsulant to flow into the gap and around the solder balls. An energy is applied to cure the encapsulant once the void/bubble has been completely removed thereby ensuring that new voids and/or bubbles do not re-occur between the flip chip device and the substrate. Typically, heat and/or ultra-violet radiation are used as the applied energy.

In another embodiment of the present invention, the method includes creating a substantially void/bubble free interposer layer between a microelectronic component and a sheet-like substrate. According to this method, an interposer layer is injected into a gap between the microelectronic component and the substrate such that any voids or gas bubbles are sealed within the gap. Isostatic or hydrostatic pressure is then applied to the entire assembly which causes the total volume for the voids/bubbles to be reduced to the point where they are substantially eliminated from the interposer layer. A further step of applying energy, such as heat, is employed to cure the interposer layer thereby ensuring that future void/bubble do not occur.

The injecting step may include providing a curable, liquid encapsulant at each edge of the gap between the microelectronic component and the substrate prior to the step of applying pressure, effectively sealing the space between the component and the substrate. When the pressure is then applied, it causes the sealed volume to be reduced thereby allowing the encapsulant to flow into the gap and form a substantially void/bubble free interposer layer.

A still further embodiment of the present invention includes a method of treating an interposer layer for a semiconductor package assembly to provide a substantially void/bubble free interposer layer. An interposer layer is first disposed between a semiconductor chip and a sheet-like substrate such that any voids within or at the boundaries of the interposer are sealed within the assembly. An isostatic or hydrostatic pressure is then applied to the assembly thereby reducing the volume of the voids/bubbles and substantially eliminating them from the interposer layer.

The foregoing, and other objects and advantages of the present invention will be better understood from the following Detailed Description of a Preferred Embodiment, taken together with the attached Figures.

BRIEF DESCRIPTION OF THE DRAWINGS

FIGS. 2N-1 through 2N-7 show the process of creating a void free layer by injection using the center bonded package having a peelable compliant layer, according to the present invention.

DETAILED DESCRIPTION OF A PREFERRED EMBODIMENT

The present invention is directed toward the pressure injection of encapsulants into cavities and gaps in microelectronic structures and the simultaneous removal of voids and gas bubbles within encapsulants and adhesive/chip attach layers. As described below, the present inventive methods may be used as a method for underfilling attached flip chip devices, for injecting encapsulant and for removing voids and gas bubbles within encapsulants. As will be appreciated by one skilled in the art, each of the embodiments described below could and preferably would be performed on more than one assembly at a time to facilitate the mass production of finished parts.

I. FLIP CHIP UNDERFILL ENCAPSULATION

Figure 1A:
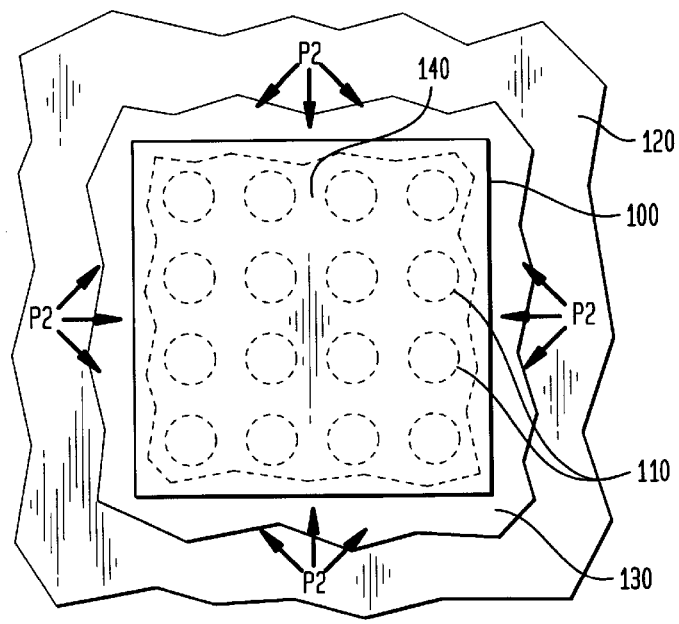
FIG. 1A shows a top plan view of a flip chip device attached to a circuitized substrate having encapsulant sealing the edges therebetween, according to the present invention.
Figure 1B:
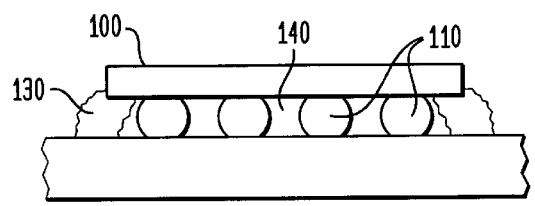
FIG. 1B shows a fragmentary side view of the elements shown in FIG. 1A, according to the present invention.

FIGS. 1A–D show a preferred method of providing a substantially gas bubble/void free underfill for a flip chip assembly, according to the present invention. FIG. 1A shows top fragmentary view of a flip chip type assembly including a semiconductor chip 100, a supporting substrate 120 (such as a PWB), a plurality of electrical connections 110 interconnecting corresponding chip contacts (not shown) and bond pads (not shown) on the substrate 120. The solder connections both electrically and mechanically interconnect the chip contacts to the bond pads and, as best shown in FIG. 1B, provide a "stand-off" or gap between the chip 100 and the substrate 120. Although many metals, conductive composites and alloys would be suitable to act as the electrical connections 110, the electrical connections 110 are typically comprised of an alloy of tin and lead, referred to generically in the semiconductor packaging industry as "solder balls".

Figure 1C:
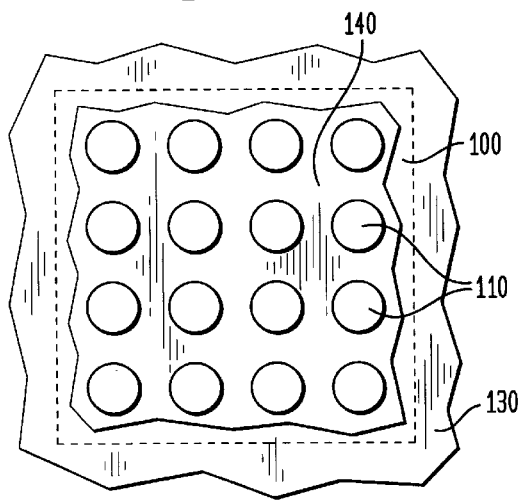
FIG. 1C shows a bottom plan view of the elements shown in FIG. 1A with the substrate removed from view, according to the present invention.

FIG. 1C shows a bottom view of the assembly shown in FIG. 1A with the substrate 120 removed from view.

As shown in FIGS. 1A–B and the side fragmentary view of FIG. 1B, a curable, liquid encapsulant material 130 is deposited at each of the edges of the chip 100 so as to seal the gap between the chip 100 and the substrate 120 creating a sealed void or gas bubble 140 therebetween (depending on whether the surrounding environment has been evacuated prior to the sealing step). For the sake of simplicity, this void/bubble 140 will generically be referred to in this specification and in the claims as a "void". Typically, in flip chip embodiments, the encapsulant is comprised of a curable thermoset resin material. Since it is desired in a flip chip mounted device to have the encapsulant rigid after it is cured, an example of a suitable resin would include an epoxy resin, such as Hysol® epoxy sold by Dexter Corporation of Pittsburg, Pa.

Isostatic pressure is then applied to the outside of the assembly. This step of applying more pressure on the assembly after the void 140 has been sealed will cause a pressure differential between the compressive, ambient gas applied to the outside of the assembly and any first gas trapped within the void 140. The average diameter of the void 140 will thus be reduced allowing the encapsulant to begin encapsulating the outermost solder connections 110 on all four sides of the chip 100. This pressure differential further causes the encapsulant 130 to flow between the chip and the substrate and around the connections. The amount of pressure required to collapse the void 140 depends on the type of encapsulant 130 used and on the desired time period to entirely collapse the void 140. Typically, if more pressure is used, less time is required to collapse the void 140. The amount of pressure applied may also depend on how the pressure is applied, i.e. all at once in a virtual pressure "step" or gradually in progressively increasing pressure steps. While either pressure application method may be used, using one virtual pressure step increases the rate of collapse of the void 140. By way of example, the applied ambient gas pressure may be approximately between 10 and 1000 pounds per square inch ("psi") and will be applied for between thirty minutes to several hours; although typically no harm will come to the assembly if it is allowed to remain within the pressurized environment beyond this specified time frame. Such pressure may be supplied by an autoclave device such as has been used in the aerospace industry; although the required size of an autoclave for the removal of voids within encapsulation is typically much smaller than required for the aerospace industry. An example of a possible autoclave device is the Mini-bonder autoclave manufactured by United McGill of Westerville, Ohio.

Figure 1D:
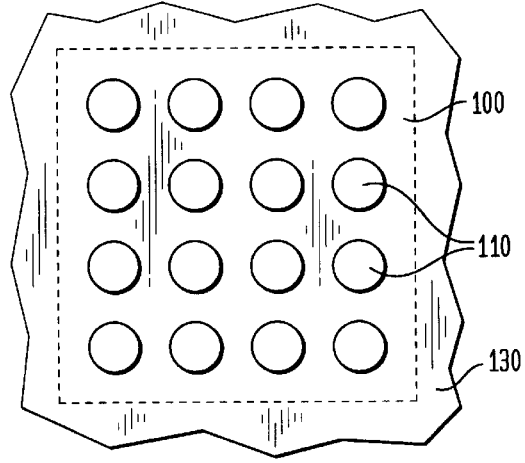
FIG. 1D shows a bottom plan view of the elements shown in FIG. 1A with the substrate removed from view and after full encapsulation, according to the present invention.

Eventually, the trapped first gas in the void 140 will begin to reach an equilibrium state with the ambient pressure applied to the outside of the assembly, i.e. the pressure of the first gas ($P_1$) will be approximately the same as the ambient pressure ($P_2$). At this time, the added pressure due to the surface tension ($P_t$) of the void 140 begins to play a more dominant role. As the void 140 gets smaller, the surface tension induced pressure acting on any first gas within the void 140 gets larger. At some point, during a second time period, the sum of the pressures within the void 140 ($P_1$) will become greater than the ambient pressure ($P_2$) acting on the outside of the assembly. At or near this point, the first gas within the void 140 will slowly diffuse into the encapsulant 130. Since the gas within the void 140 is under higher pressure, during the second time period, than the ambient gas acting on the outside of the assembly, the rate of diffusion of the first gas into the encapsulant 130 will be greater than the rate of diffusion of the ambient gas into the encapsulant 130 causing the void 140 to get smaller still. As the diameter of the void 140 gets smaller and smaller, the pressure due to the surface tension ($P_t$) of the void 140 will progressively grow greater and greater, up until the point where the gas within the void is completely diffused within the encapsulant, as shown in FIG. 1D, and the void implodes.

If the area around the flip chip device has been evacuated prior to the sealing step, there will of course be virtually no first gas within the void 140. This being the case, the combination of the ambient pressure ($P_2$) and the surface tension pressure ($P_t$) "push the encapsulant in to the void 140 while aided by a "pulling effect" created by the vacuum within the void 140 pulling the encapsulation into the void 140. Thus, an evacuation step prior to the sealing step will cause any voids 140 to collapse more quickly.

Typically, the next step includes applying energy to cure the encapsulant 130. The object of applying the curing energy is to fully cure (cross-link) the encapsulant 130 so that new voids will not reoccur such as may happen when the ambient gas pressure ($P_2$) is released quickly. The type of applied energy will depend on what encapsulant is used and how that particular encapsulant cures. Examples of possible sources of energy include heat, ultra-violet radiation, catalysis and combination thereof. When an epoxy, such as Hysol®, is used as the encapsulant, heat is typically applied as the curing energy. An appropriate temperature range will again depend on the type of encapsulant 130 used and the length of time desired to fully cure the encapsulant 130. A fully cured, thermoset encapsulant 130 will maintain its structural integrity without allowing new voids to occur. It has also been found that the step of applying energy may occur after the ambient gas pressure ($P_2$) is removed from the assembly without the reoccurrence of voids 140 if the ambient gas pressure ($P_2$) is released slowly enough so as to allow any dissolved gases within the encapsulant 130 to come to equilibrium with the surrounding ambient gas.

In a variation of this process, a first gas within the void 140 and an ambient gas may be comprised of different gases to facilitate the diffusion of the first gas into and through the encapsulant 130 at a greater rate than the rate of diffusion of the ambient gas into the encapsulant. After the step of sealing the gap between the chip 100 and the substrate 120, the first gas surrounding the assembly may be evacuated and another ambient gas may take its place. In such an embodiment, the first gas contained within the void 140 may have smaller molecules than the ambient gas accelerates first gas' diffusion into the encapsulant 130. Choosing the correct sealed first gas will necessarily entail choosing the correct ambient gas and vice-versa. Examples of sealed first gases include helium, hydrogen, $H_2O$ vapor, etc. Examples of ambient gases when compared with the first gases listed above include argon, air, nitrogen, carbon dioxide and Krypton.

In a further variant of this process, hydrostatic pressure could be used instead of the isostatic pressure discussed above to compress the voids/bubbles. Typically in such a process, inert fluids would be used to compress the voids/bubbles.

II. INJECTION OF AN ENCAPSULANT

Figure 2A:
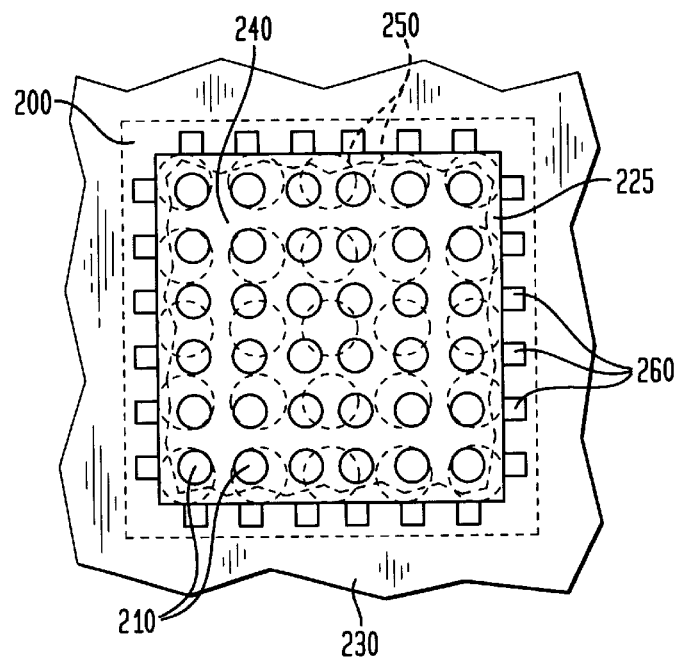
FIG. 2A shows a top plan view of a semiconductor package assembly having an encapsulation sealing the edges of a gap between a sheet-like substrate and a semiconductor chip, according to the present invention.
Figure 2B:
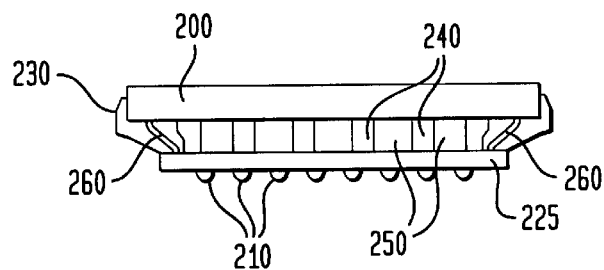
FIG. 2B shows a fragmentary side view of the elements shown in FIG. 2A, according to the present invention.
Figure 2C:
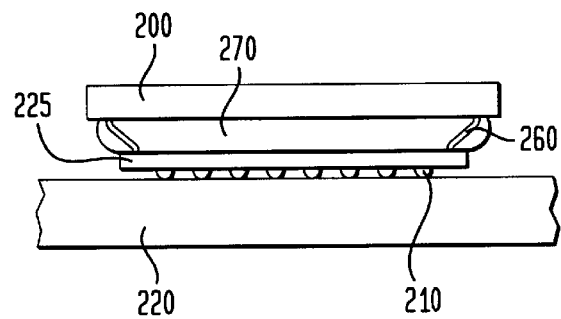
FIG. 2C shows a fragmentary side view of the elements shown in FIG. 2A after full encapsulation, according to the present invention.

As shown in FIGS. 2A–C, the methods described above in connection with encapsulating flip chip device may also be used to inject a fluid encapsulant between a first intermediate substrate 225 and a chip 200 as well. One such embodiment where injection of encapsulation is described is in U.S. patent application Ser. No. 08/365,699 filed Dec. 12,1994, which is hereby incorporated by reference. In brief, as shown in part in FIGS. 2A–C, the '699 application describes a method and structure for disposing a plurality of compliant pads 250 which provide a stand off or gap between a first sheet-like support structure 225, and a contact bearing face surface of a semiconductor chip 200. The first substrate 225 may be rigid, semi-rigid or flexible. For added CTE compensation, preferably the first substrate 225 is a substantially inextensible dielectric film, such as polyimide having a thickness of between 0.5 mils and 3 mils.

As described above, the adjacent compliant pads 250 provide the structure for the gap between the chip 200 and the first substrate 225 and provide and define channels therebetween for the encapsulant 230 to eventually flow; however other alternatives could be used instead, such as cellular foam, loosely woven non-conductive strands, etc. It is only important that a gap be provided between the chip 200 and the first substrate 225 while holding the two items in a substantially coplanar relationship. The compliant pad embodiment will be described in this example. As described in the '669 application, the compliant pads 250 are typically deposited, as by stenciling, and cured so that the chip 200 and the first substrate 225 are attached to each other in a substantially coplanar relationship. A curable liquid encapsulant 230 may then be deposited completely around the perimeter of the gap between the chip 200 and the first substrate 225 so as to seal the pads 250 and create a sealed void (void/gas bubble) 240 out of the network of the channels therewithin, very much like the sealed assembly described in the flip chip embodiment above. Typically, a curable, compliant thermoset resin is used as an encapsulant, such as silicone and flexiblized epoxy. Alternately, thermoplastic materials may be used if they are specially formulated to undergo a phase change such that they go liquid under certain conditions and not under others, such as at a temperature which would be typically higher than the normal operating temperature of the resulting device.

An isostatic pressure is then applied to the assembly causing the encapsulant to flow between the chip 200 and the first substrate 225 and into the channels within the void 240. Again, the ambient gas pressure applied will depend on the encapsulant material selected and the amount of time desired for the process of removing the void 240; and further on whether the pressure is applied in a virtual step or is applied gradually. The typical applied ambient gas pressure here will be approximately between 10 and 450 pounds per square inch ("psi"), and preferably between about 30 and 200 psi, for a time period of between about thirty minutes and several hours (the time period also depends on the volume to be encapsulated). A virtual step of ambient gas pressure is preferred in order to increase the rapidity of the void removal.

As described above, the step of applying pressure on the assembly after the void 240 has been sealed will cause a pressure differential between the compressive, ambient gas applied to the outside of the assembly and any first gas trapped within the void 240. The average diameter of the void 240 will thus be reduced allowing the encapsulant to begin encapsulating the outermost compliant pads 250 on all four sides of the chip 200.

The pressure from the ambient gas combined with the pressure from the surface tension of the void 240 itself will cause the void to grow smaller. If there is a first gas trapped within the void, as the first gas pressure becomes greater than the pressure due to the ambient gas pressure, the first gas will begin to diffuse into the encapsulant 230. Since any first gas within the void 240 is under higher pressure, during the second time period, than the ambient gas acting on the outside of the assembly, the rate of diffusion of the first gas into the encapsulant will be greater than the rate of diffusion of the ambient gas into the encapsulant. As the diameter of the void 240 gets smaller and smaller, the pressure due to the surface tension of the void 240 will progressively grow greater and greater, up until the point where the void 240 is completely removed from the encapsulant, as shown in FIG. 2C.

As described in the last section, energy is typically applied to cure the encapsulant 230. The type of energy applied depends on the encapsulant 230 selected and under what conditions the selected encapsulant 230 cures. If a silicone is used as the encapsulant, the energy applied is typically heat. The amount of heat and the length of time the heat is applied is again dependent upon the selected encapsulant material and the volume of material that needs to be cured. As described above, the application of energy will typically occur prior to the termination of the step of applying pressure so that no new voids are allowed to develop in the encapsulant by the reduction of the ambient pressure. A fully cured, thermoset encapsulant 130 will maintain its structural integrity so that gas bubbles and voids do not reenter the encapsulant. The above mentioned variations and embodiments listed in the Flip Chip Underfill Encapsulation section, above, would also facilitate this injection process.

Thus, in the configuration shown in FIG. 2C, the internal high stress zones in the chip package assembly are reduced by the substantial removal of the voids and bubbles in the cured compliant layer 270. This method of injection also works where the encapsulant is injected between a first substrate and a second substrate, such as in a fan-out chip package embodiment where at least some of the terminals 210 are disposed above a second support structure such as a thermal spreader or ring, as described more fully in the '669 application.

Figure 2D:
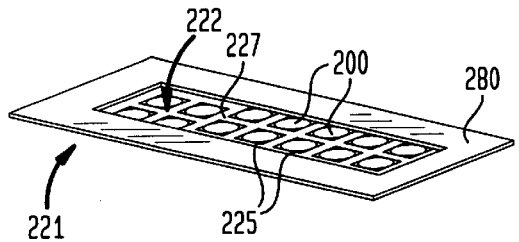
FIG. 2D shows a perspective view of a plurality of chips attached to a substrate which is connected to a frame to support the substrate, according to the present invention.

As described above and shown in FIGS. 2D–2G, the above injection methods are preferably performed on more than one assembly at a time to facilitate the mass production of finished parts. FIG. 2D shows a perspective view of a plurality of chips 200 attached to a substrate 222, which includes the first substrate 225 and a sacrificial outer portion 227. An outer portion of the substrate 222 is also attached to a rigid or semi-rigid frame 280 to support the typically flexible substrate 222 such that it is stretched taut across the frame and further to better ensure the dimensional stability of the substrate. Since the combined thickness of the chips 200 and the substrate 222 is fairly thin, the thickness of the frame 280 is also typically thin so that a plurality of such assembled frames 221 may be placed in the same pressure/temperature vessel after the encapsulant has been deposited, as described above.

Figure 2E:
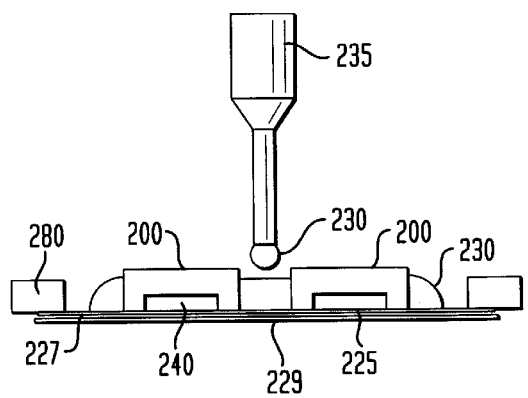
FIG. 2E shows a side view of a nozzle for depositing the encapsulant around the edges of the gap between the chips and the substrate in FIG. 2D so as to seal the voids.

FIG. 2E shows a nozzle 235 for depositing the encapsulant 230 around the edges of the gap between the chips 200 and the first substrate 225 so as to seal the voids 240. A CAM/ALOT programmable dispensing machine manufactured by Camelot Systems, Inc. in Haverhill, Mass. could be used to perform such a task. In this configuration, the encapsulant 230 is deposited from the chip side of the frame assembly 221. A layer of sheet-like material 229, such as a coverlay or solder mask material, is attached to the terminal 210 side of the substrate 222 so that the encapsulant is bounded and does not escape through the bonding apertures 228 (FIG. 2I) such that it could contaminate the terminals and thus impede any subsequent electrical connection of the terminals to the bond pads on the circuitized substrate 220. The frame 280 also acts as a barrier to provide a side boundary for the deposited encapsulant should the need arise. However, preferably, the encapsulant 230 has a thick enough consistency such that it substantially maintains its shape through the surface tension of the material. Most preferably, the encapsulant 230 is deposited such that it does not flow onto the back surface (non-contact bearing surface) of the chip 200. This allows the back surface of the chip to subsequently be connected to a heat sink or thermal spreader without an insulative material impeding the dissipation of heat from the chip 200 during thermal cycling.

After the gap has been sealed, the frame assembly 222 is placed within a pressure chamber, such as the aforementioned autoclave chamber, and an isostatic pressure is applied to collapse the voids and/or gas bubbles 240 thereby causing the encapsulant to engulf the supports 250 and provide a substantially void free interposer layer, as described above. Preferably, a plurality of frames 280 are placed within a frame assembly carrier 285 so that the frames 280 may be more easily stacked together and placed within the pressure chamber. In the embodiment shown in FIG. 2F, the frames are placed within the carrier 285 such that the opposite edges of the frames rest upon small shelves or projections 286 extending from the side walls of the carrier 285. In another examples, the frames 280 may simply be optimized such that a plurality of such frames 280 may be stacked one on top of the other such that the individual frames do not come into contact with the substrate 222 or chips 200 on an adjacent frame 280. Energy is then applied to cure the encapsulant, as described above.

Figure 2G:
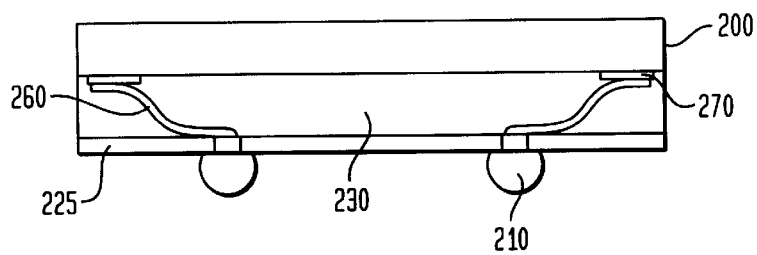
FIGS. 2G and 2H show cross sectional side views of two packaged devices, according to the present invention.

The fully encapsulated semiconductor chip packages within the frame assemblies 221 are next separated (or "diced") from their respective frame/substrate into single packaged chips, such as that shown in FIG. 2G, or the packaged chip may be diced into multi-chip modules. The dicing operation is typically performed by laser cutting, stamping or sawing (such as with a water saw). The component in FIG. 2G has some benefits when compared with the embodiment depicted in FIG. 2C. First, the first substrate 225 is extended to be the same size as the contact 270 bearing surface of the chip 200. This allows the cured encapsulant layer 230 (interposer layer) to have a substantially uniform thickness at every point between the chip 200 and the first substrate 225, even at the periphery of the package. This provides added support for the leads 260 during thermal cycling of the component as well as added physical and environmental protection for the metallurgy of the connection between the leads 260 and the contacts 270.

Figure 2H:
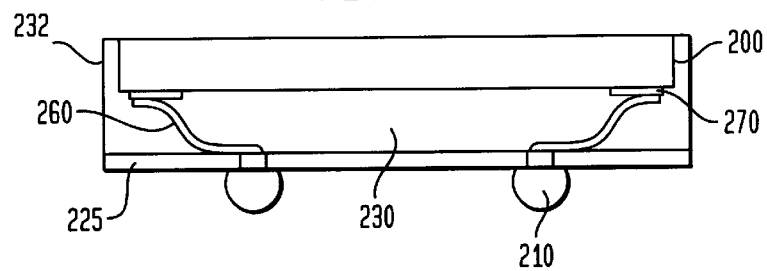

FIG. 2H shows a side view of an alternate embodiment which is similar to the embodiment shown in FIG. 2G. However, in FIG. 2H, the first substrate 225 is juxtaposed with the contact 270 bearing surface of the chip, but is larger than the surface of the chip 200 such that it uniformly extends beyond the perimeter of the chip 200. The interposer layer 230 correspondingly extends beyond the chip perimeter to form a bumper of encapsulant material 232. This structure may be created by dicing the packaged chips a short distance beyond the periphery of the chip 200 itself. The bumper 232 further protects the chip and the metallurgy of the connection of the leads 260 to the contacts 270.

Figure 2I:
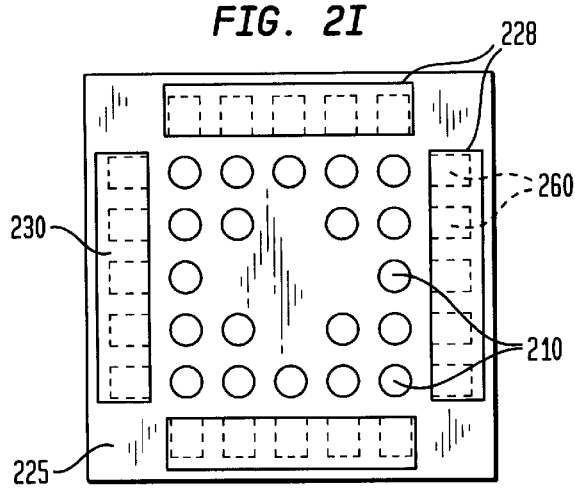
FIG. 2I shows a face view of the chip package described in FIGS. 2G and 2H, according to the present invention.
Figure 2F:
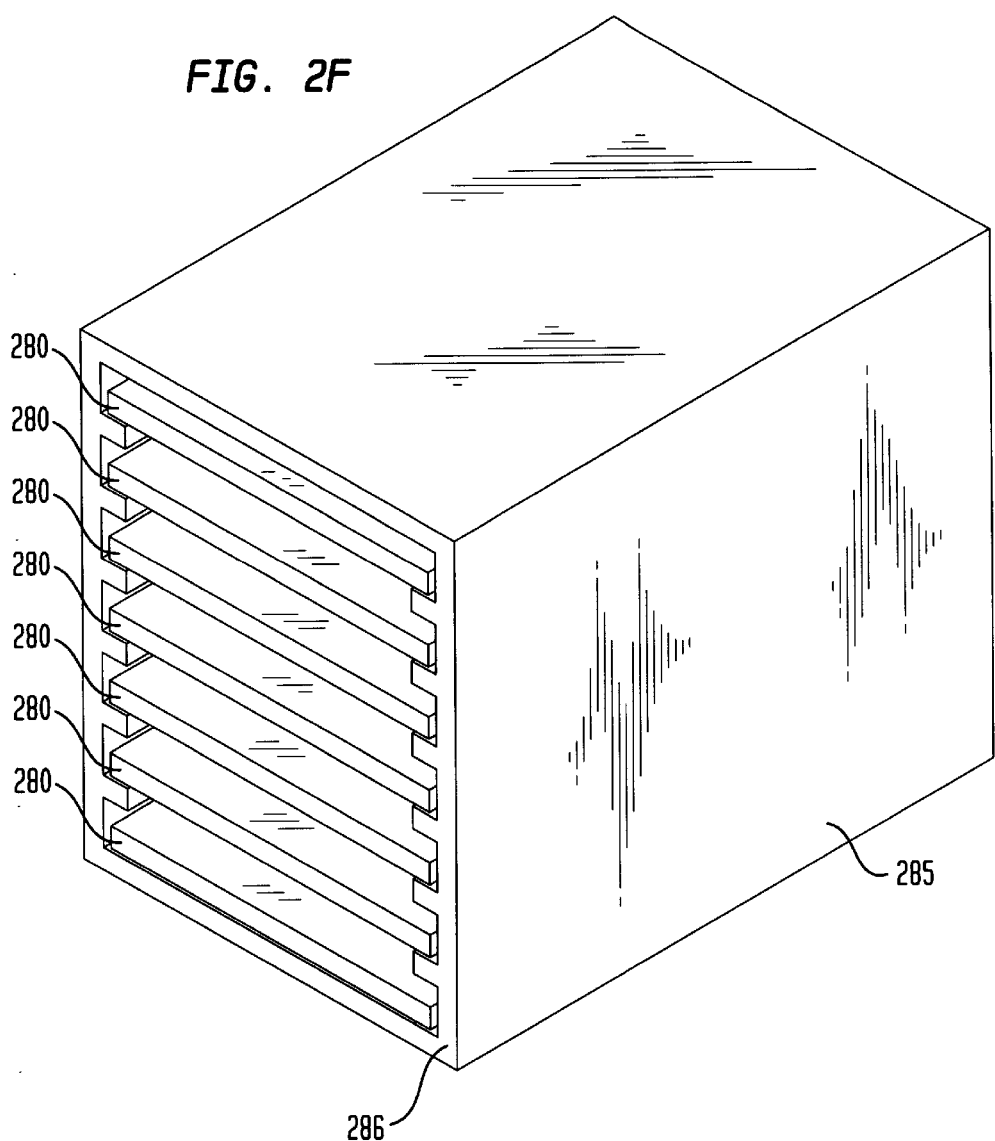
FIG. 2F shows a perspective view of the a plurality of the frames show in FIG. 2D are placed within a single carrier.

FIG. 2I shows a face surface view of the chip package described in FIGS. 2G and 2H. The bonding windows 228 allow the leads 260 to be detached from the sacrificial substrate 227 and be bonded to respective chip contacts 270.

Figure 2J:
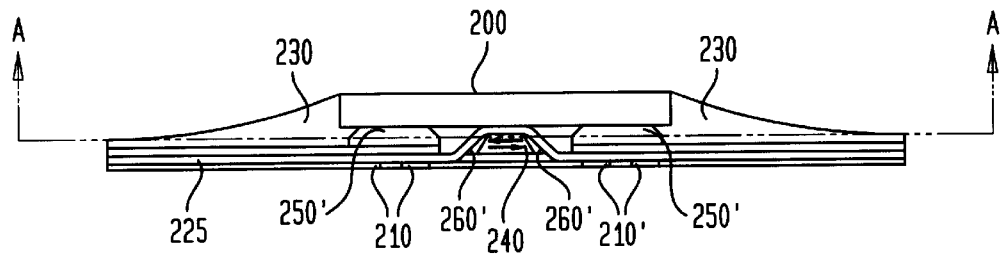
FIG. 2J shows a cross sectional view of a center bonded package as the void is being diffused into the encapsulation material, according to the present invention.
Figure 2K:
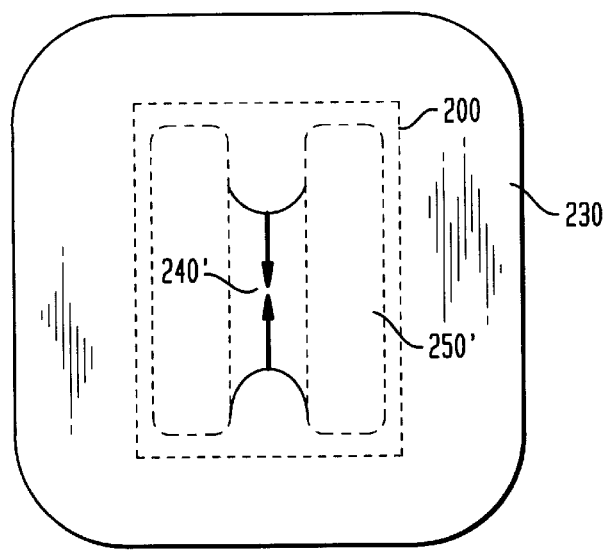
FIG. 2K shows cut-away cross section A from FIG. 2J depicting the collapsing of the void in response to isostatic pressure, according to the present invention.
Figure 2L:
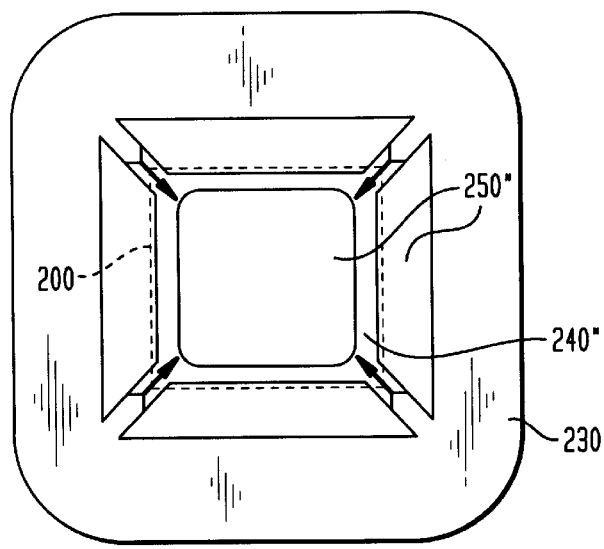
FIG. 2L shows a cut-away cross sectional view of a fan-in/fan-out embodiment, according to the present invention.

FIG. 2J shows a cross section view of a center bonded package as the void 240 is being diffused into the encapsulation material 230. The package in this Figure is similar to the package shown in FIGS. 2A and 2B except that in FIG. 2J the die 200 is rectangular and the plurality of compliant pads 250 have been replaced by two compliant pads 250' which create a single center channel 240' therebetween instead of rows and columns of channels 240. Also, the leads 260' in FIG. 2J are chip contacts which are located in a central portion of the contact bearing surface of the chip such that the leads 260' extend from either side of channel 240' and are bonded to the contacts in somewhat of an interleaving pattern, instead of being bonded to contacts which are peripherally positioned on the chip. The encapsulant 230 is again deposited at the edges of the gap created by the compliant pads 250' sealing void within channel 240'. FIG. 2K shows cross section A from FIG. 2J depicting the collapsing of the void 240' in response to isostatic pressure and any first gas contained within the void being diffused into the encapsulant, as described in the above embodiments. FIG. 2L shows the same type of void 240" collapse described above except that the compliant pads 250" define a differently shaped void 240". In this Figure, the compliant pads 250" are located in the central portion of the chip 200 and beyond the periphery of the chip 200 (typically there is a support structure surrounding the chip to support the peripheral pads). This arrangement allows for a so called "fan-out" or "fan-in/fan-out" semiconductor package embodiment in which the terminals 210 on the substrate 225 may be located in above the chip surface or beyond the chip's periphery or both, as described above.

Figures 1, 2M:
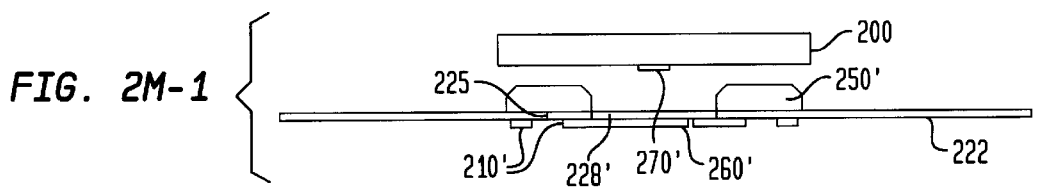
FIGS. 2M-1 through 2M-7 show the process of creating a void free layer by injection using the center bonded package shown in FIG. 2J, according to the present invention.
Figures 2, 2M:
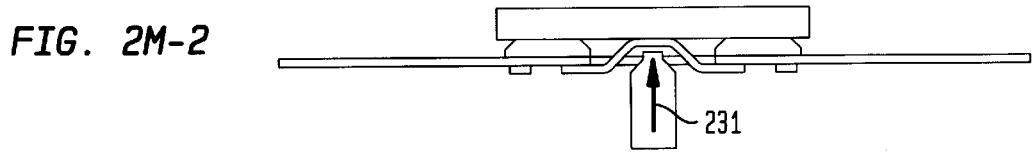
Figures 2, 2M, 3:
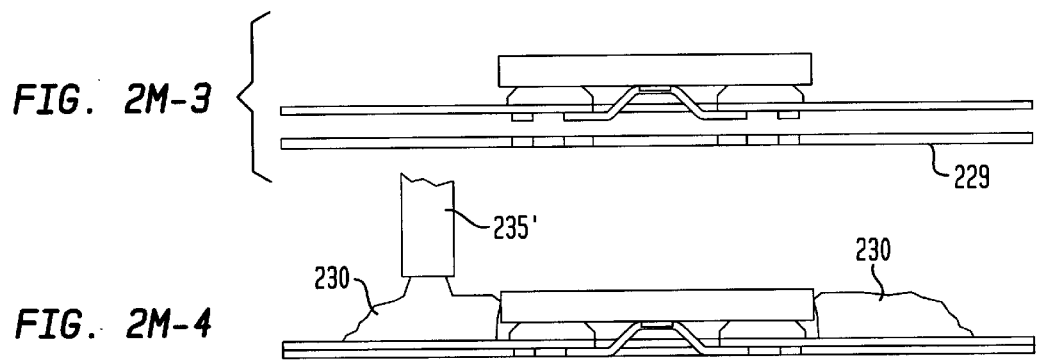
Figures 2, 2M, 3, 4:
Figures 2, 2M, 3, 4, 5:
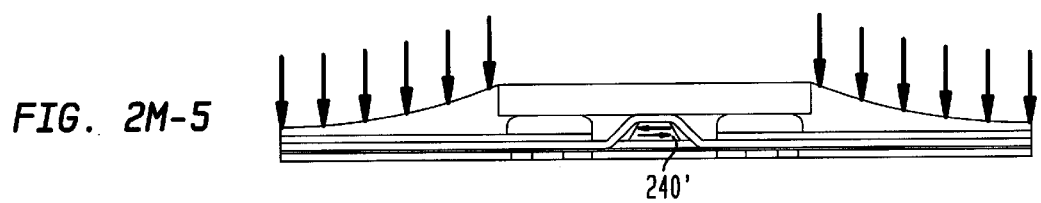
Figures 2, 2M, 3, 4, 5, 6:
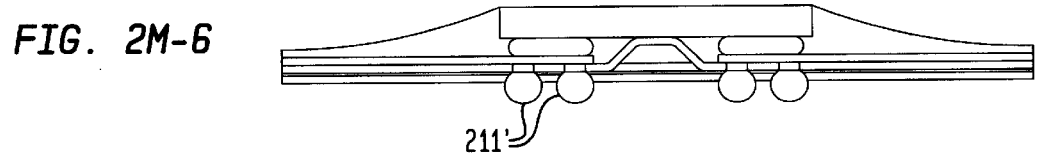
Figures 2, 2M, 3, 4, 5, 6, 7:
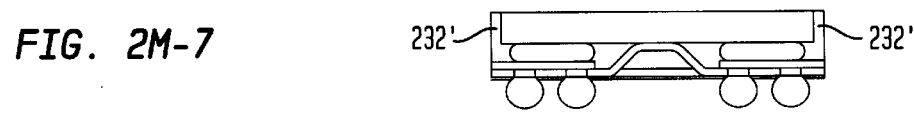

FIGS. 2M-1 through 2M-7 graphically shows the above described method (discussed in relation to FIGS. 2D through 2I) with respect to the center bonded embodiment of FIG. 2J. In this embodiment, the chip 200 is attached to the compliant pads 250' attached to the tape 225. The tape has a bonding window so that the leads 260' may extend and typically detachably held in place thereacross. As shown in FIG. 2M-2, the leads are detached from the substrate 225, guided and bonded to respective chip contacts 270' using a bonding tool 231 which typically bonds the leads to the contacts using ultrasonic or thermosonic or thermocompression means or some combination thereof, as shown. FIG. 2M-3 shows a protective sheet-like layer 229, such as a coverlay or solder mask layer, is attached to the terminal 210 side of the substrate 222 so that the encapsulant may be bounded and will not escape through the bonding apertures 228' so that it does not contaminate the terminals and impede any subsequent electrical connection of the terminals 210 to the bond pads on the circuitized substrate.

FIG. 2M-4 shows a nozzle 235 depositing encapsulation material 230 around the chip 200 on the chip/compliant pad bearing surface of the substrate 222 so as to seal the gap/void 240' between the chip 200 and the substrate 225, as described in more detail above. It is evident from this that the protective layer 229 is performing the function of sealing any apertures in the substrate 225, such as the bonding aperture 228'. FIG. 2M-5 shows the application of isostatic force and the resulting collapse of the void 240'. At this point, any gas which may be within the void 240' diffuses into the encapsulation material 230 at a rate which is faster than the rate of gas diffusion from outside the sealed area causing the voids 240' to reduce in size and further causing the eventual removal of the voids 240', as shown in FIG. 2M-6. FIG. 2M-6 further shows the application of solderballs 211 to the terminal sites 210. FIG. 2M-7 shows a finished semiconductor package after it has been cut away (or "diced") from the frame assembly, shown in FIG. 2D, by laser cutting, stamping or sawing (such as with a water saw).

In this particular embodiment, the package is diced such that a bumper 232 of encapsulation material is left along the side edges of the chip 200, similar to the embodiment shown in FIG. 2H. In a variation, the package may be diced such that there is no bumper 232. In a further variation, a final step may be added in which a thermoset or thermoplastic resin sheet-like layer is vacuum laminated onto the back of the chip 200 and around each of the sides of the package to add further protection and durability to the package.

Figures 1, 2N:
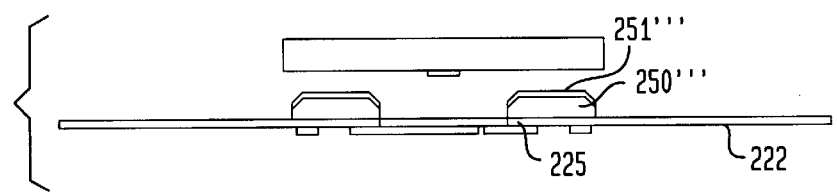
Figures 2, 2N:
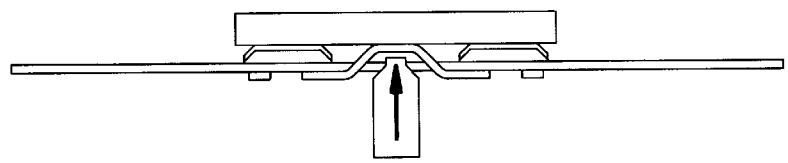
Figures 2, 2N, 3:
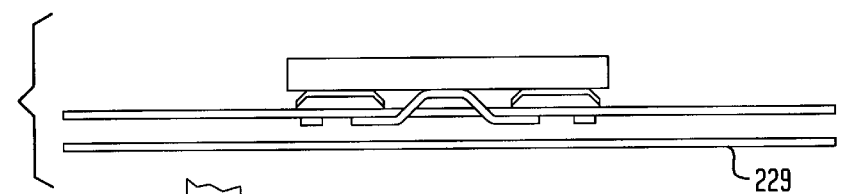
Figures 2, 2N, 3, 4:
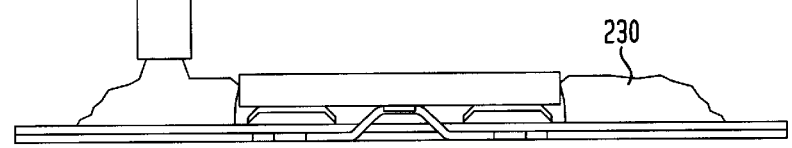
Figures 2, 2N, 3, 4, 5:
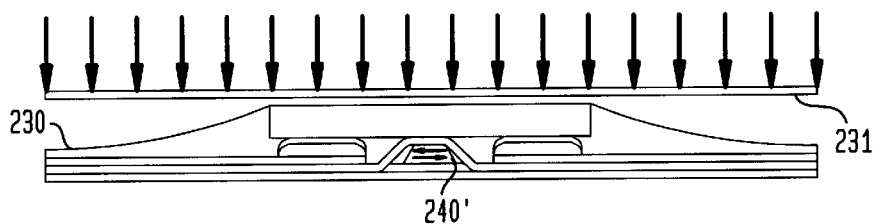
Figures 2, 2N, 3, 4, 5, 6:
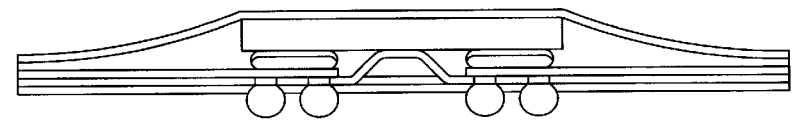
Figures 2, 2N, 3, 4, 5, 6, 7:
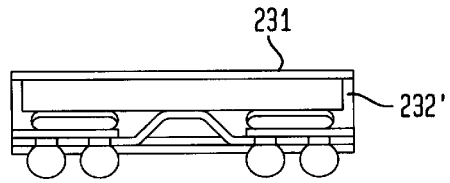

FIGS. 2N-1 through 2N-7 show a further variation on the processes and structures shown in FIG. 2M-1 through 2M-7 in which a reworkable package structure is disclosed. In FIG. 2N-1, a compliant layer 250''' is attached to the substrate 225 by means of a peelable tacky surface 251'''. This peelable compliant layer must be compliant enough to accommodate the CTE mismatch problems in thermal cycling of the finished device, yet have the ability to be removed (or peeled off) from the substrate 225 or allow the chip 200 to be removed after attachment without substantial residue on the substrate or chip. Examples of possible materials for the peelable compliant layer 230 include structures which have inherent releasable adhesive properties, such as pressure sensitive adhesives, and structures which may be "impregnated" so that they have such releasable adhesive properties, such as cured silicone pads impregnated with pressure sensitive adhesives or fully cured pads of tacky silicone gel, or fully cured compliant pad structures which have releasable adhesive on the major opposing surfaces.

As shown in FIG. 2N-2 and described above, the chip 200 is then attached to the tacky surface 251''' and the leads are bonded. If there is a problem or defect with the package up to this point, the chip 200 may be removed and reused thereby providing a cost saving to chip manufacturers. Further, if the problem is with the pad 230 and the lead bonding function has not occurred, the pad may be removed from the substrate 225 and a new pad 250''' may be used in its place.

Such a releasable package structure would encounter durability problems in use of the finished package due to the possibility of the pads 250'''/251''' peeling away from either the substrate 225 or the chip 200 or both unless, at some point before the package is shipped to a customer, the peelable nature of the pad is neutralized. FIG. 2N-4 shows the encapsulant 230 being deposited on the substrate 222 at the periphery of the chip 200 so as to seal the area between the chip 200 and the substrate 225, as explained earlier. Isostatic pressure is placed on the assembly so as to reduce the volume of the void 240. As explained above, during this step, any first gas trapped within the void 240 diffuses into the encapsulant until the void 240 has been completely removed, as shown in FIG. 2N-6. At this point, the encapsulant completely surrounds the peelable compliant pad 250''' thereby provided the needed means to bind the chip 200 to the substrate 225 prior to shipment to an end user, as shown in FIG. 2N-7.

In a variation to this process, a pressure sealed membrane 231 may be applied or deposited in a sheet form atop the assembly, as shown in FIGS. 2N-5 and 2N-6, prior to the application of pressure thereby, in effect, laminating the membrane to the structure (back surface of the chip 200 and exposed surface of the encapsulant 230). Such a membrane 231 may be permanently sealed to the back of the chip 200 protecting the chip 200 and further binding the bumper portions 232 so that they do not de-laminate from the side edges of the chip 200 after the package has been diced, as shown in FIG. 2N-7. Alternately, the membrane 231 may be removed from the back of the die leaving the back surface of the chip 200 bare to be subsequently attached to a cooling surface or heat sink.

In a still further variant of this process, hydrostatic pressure could be used instead of the isostatic pressure discussed above to compress the voids/bubbles. Typically in such a process, inert fluids would be used to compress the voids/bubbles.

III. TREATING AN INTERPOSER LAYER

FIGS. 3A–E show a similar design to that shown in FIGS. 2A–C; however, in this embodiment, an interposer layer, such as a compliant pad 330, is disposed between the first substrate 325 and the semiconductor chip 300. The present invention provides a method of treating the pad 330 to provide a substantially void free layer. Typically, the compliant pad 330 is comprised of a curable thermoset resin, such as silicone, flexiblized epoxy, urethane elastomer or polyimide foam. In the embodiments shown in FIGS. 3A–E, the first substrate 325 is typically comprised of a substantially inextensible sheet-like material, such as polyimide, which may be substantially rigid, semi-rigid or flexible.

Figure 3A:
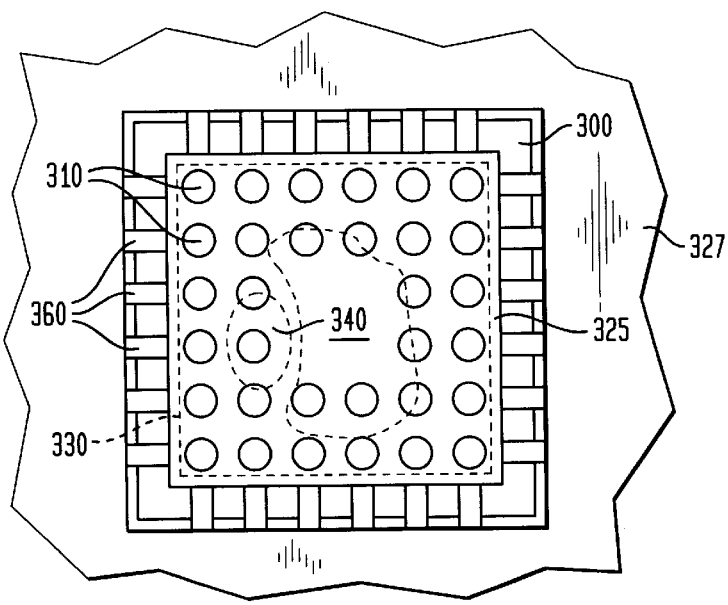
FIG. 3A shows a top plan view of a semiconductor package assembly having an interposer layer disposed between a sheet-like substrate and a semiconductor chip, according to the present invention.
Figure 3B:
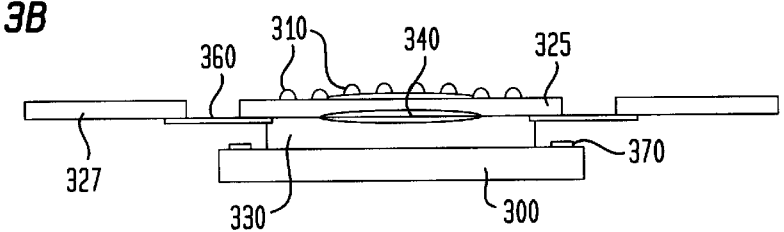
FIGS. 3B and 3C show fragmentary side views of the elements shown in FIG. 3A, according to the present invention.
Figure 3C:
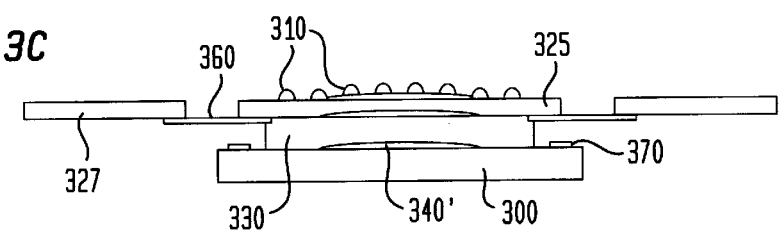

The pad 330 may be positioned and attached as a solid piece, as with adhesive on opposing sides thereof, or it may be stenciled or screened onto the face surface of the chip 300 or onto the opposing surface of the first substrate 325. Typically, it is stenciled onto the first substrate 325 prior to the leads 360 being detached from a sacrificial outer portion 327 of the first substrate and formed and bonded to respective chip contacts 370. The stenciled pad 330 is then at least partially cured. If a thicker compliant pad 330 is desired or if added adhesive properties are required a chip attach layer (not shown) may then be deposited on top of a typically fully cured pad 330, as by a stenciling step. The chip attach layer may be then be left either uncured or may be partially cured ("B-staged") prior to the attachment of the chip 300. Preferably, the chip is attached using a heated collet placement system so that the chip is relatively hot when it is pressed against the chip attach layer so as to minimize the number and size of any voids (or gas bubbles) 340/340'. Typically, these voids will occur at the boundary between the different materials in the assembly, e.g. first substrate/compliant pad, compliant pad/chip or even compliant pad/chip attach layer depending upon the materials chosen for those two materials. Even using a hot chip placement system, gas bubbles or voids 340/340' are difficult to avoid in the uncured chip attach layer whether from the entrapment of gas when the chip is attached (FIG. 3B) or when the pad 330 is stenciled (FIG. 3C).

After the chip 300 has been attached and the voids 340/340' have been sealed within the package assembly, the assembly is placed under isostatic pressure for a given amount of time to remove the voids 340/340'. As in the embodiments described above, the step of applying an isostatic ambient gas to the outside of the assembly is used to create a pressure gradient between the lower pressure first gas/vacuum within the voids 340/340' and the ambient gas pressure be applied to the outside of the assembly. This has the effect of compressing any first gas in the voids 340/340' thereby reducing the volume of the void and increasing the pressure therewith. If there is a sealed first gas within the voids 340/340', the pressure within the each void 340/340' is the sum of the pressure from the compressed first gas and the pressure from the surface tension of the void. As the void volume decreases, the pressure from the surface tension of the void will increase dramatically. At some point during a second time period, the sum of the pressures within the void 340 will become greater than the ambient pressure acting on the outside of the assembly. Because of the greater pressure within the void in relation to the pressure outside the assembly during second time period, the first gas within the void will begin to diffuse into the compliant pad/chip attach layer 330 faster than the ambient gas diffuses into the compliant pad/chip attach layer 330. The greater rate of diffusion of the first gas combined with the increased pressure of the first gas will cause the first gas to completely diffuse into the compliant pad/chip attach layer 330 such that the bubble has been removed.

As described in the above sections, the pressure which is needed to remove the voids will depend on the materials used as the compliant pad and the chip attach layer and will also depend on the time allotted for their removal and the total volume of the voids to be removed. An example of a suitable pressure/time range where both the compliant pad and the chip attach layers are comprised of silicone resin includes between about 10 and 1000 psi for anywhere over approximately one hour. The assembly may be kept under pressure for more than the specified amount of time, without harm coming to it.

Any first gas sealed within the void 340 may be comprised of the same gas as the ambient gas; however, the first gas and the ambient gas may also be different in order to facilitate a greater rate of diffusion of the sealed first gas. After the step of sealing the first gas by attaching the chip to the compliant pad/chip attach layer 330, the first gas present on the outside of the assembly may be evacuated and replaced with a different pressurized ambient gas. Desirably, the second ambient gas should have an inherent rate of diffusivity with respect to the chip attach layer material that is less than the rate of diffusivity of the first gas into the same chip attach material. If the chip attach material is a curable thermoset resin material, suitable examples of possible first gases include: helium, hydrogen, $H_2O$ vapor, methane and fluorinated hydrocarbons. Examples of suitable second ambient gases in such a situation include: argon, air, nitrogen, and carbon dioxide.

Typically, after the voids 340/340' have been removed from the compliant pad/chip attach layer 330, the assembly is heated in order to cure (or fully cross link) the chip attach layer to ensure that the voids 340/340' do not return prior to the removal of the ambient gas pressure being applied the assembly. As described above, other types of energy may be used to cause the chip attach layer to cure depending upon what the material is comprised.

Figure 3D:
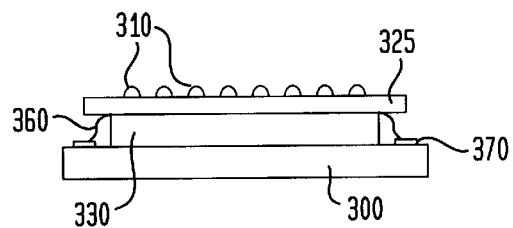
FIG. 3D shows a fragmentary side view of the elements shown in FIG. 3A after the voids/bubbles have been removed, according to the present invention.
Figure 3E:
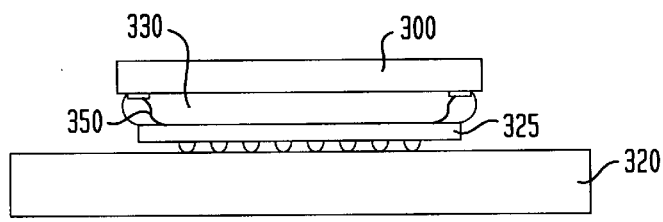
FIG. 3E shows a fragmentary side view of the elements shown in FIG. 3A after the package's leads have been encapsulated and the package is connected to a circuitized substrate, according to the present invention.

As shown in FIG. 3D, after the voids 340/340' have been removed and the compliant pad is cured, the leads 350 are typically detached from the sacrificial outer portion 327 and coupled to respective chip contacts 370. These leads are then encapsulated, as shown in FIG. 3E, to protect them from corrosion and to support them during thermal cycling of the finished chip package assembly. If voids are present in the lead encapsulant material, the voids may be removed by using the aforementioned methods. The encapsulation of the leads may also be performed using the same techniques described in the "back-side encapsulation" embodiment of FIGS. 2D–2H if the user desires to simultaneously produce a plurality of components.

In a further variant of this process, hydrostatic pressure could be used instead of the isostatic pressure discussed above to compress the voids/bubbles. Typically in such a process, inert fluids would be used to compress the voids/bubbles.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of providing a void free underfill for a flip chip assembly, comprising the steps of:
   electrically connecting a plurality of contact pads on a surface of a semiconductor chip to corresponding bond pads on a circuitized substrate such that the connections create a gap between the chip and the substrate;
   sealing the gap between the chip and the substrate with a fluid, curable encapsulant so that there is a void therebetween;
   while maintaining said seal, applying uniform pressure to the assembly causing the encapsulant to flow into the gap and around the connections; and
   applying energy to the assembly in order to cure the encapsulant.

2. The method as claimed in claim 1, wherein the uniform pressure is isostatic gas pressure.

3. The method as claimed in claim 1, wherein the uniform pressure is hydrostatic fluid pressure.

4. The method as claimed in claim 1, further comprising the step of mechanically connecting the plurality of contact pads to the corresponding electrically connected bond pads.

5. The method as claimed in claim 1, wherein the connections are at least partially comprised of solder.

6. The method as claimed in claim 5, wherein the solder is comprised of an alloy of tin and lead.

7. The method as claimed in claim 1, wherein the step of applying pressure compresses a first gas sealed within the void thereby reducing the volume of the void.

8. The method as claimed in claim 7, wherein the step of applying pressure creates a higher pressure first gas in the void relative to an ambient gas outside of the encapsulant thereby causing the gas to diffuse out of the void.

9. The method as claimed in claim 7, wherein the rate of diffusion of the first gas into the encapsulant is greater than the rate of diffusion of the ambient gas into the encapsulant.

10. The method as claimed in claim 9, wherein the first gas and the ambient gas are comprised of the same gas.

11. The method as claimed in claim 9, further comprising the step of removing the first gas from around the assembly and replacing it with the ambient gas after the sealing step.

12. The method as claimed in claim 11, wherein the encapsulant is comprised of a material which retards the diffusion of the ambient gas.

13. The method as claimed in claim 11, wherein the first gas is selected from the group consisting of helium, hydrogen, water vapor, fluorinated hydrocarbons and methane.

14. The method as claimed in claim 13, wherein the second gas is selected from the group consisting of argon, air, nitrogen, and carbon dioxide.

15. The method as claimed in claim 1, further comprising the step of evacuating gas from around the assembly prior to the sealing step.

16. The method as claimed in claim 15, wherein the step of applying pressure reduces the volume of the void.

17. The method as claimed in claim 16, wherein the encapsulant is comprised of a material which retards the diffusion of the ambient gas.

18. The method as claimed in claim 1, wherein the applied pressure is between about 10 and 1002 pounds per square inch.

19. The method as claimed in claim 1, wherein the step of applying energy includes applying heat.

20. The method as claimed in claim 1, wherein the encapsulant is comprised of a thermoset resin.

21. The method as claimed in claim 20, wherein the encapsulant is comprised of an epoxy resin.

22. The method as claimed in claim 20, wherein the encapsulant is comprised of a thermoplastic resin.

23. A method of injecting an encapsulant between a face surface of a semiconductor chip and a juxtaposed substrate, comprising the steps of:
   providing a gap between the face surface of the chip and the substrate;
   sealing each edge of the gap with a curable fluid encapsulant so that there is a void between the chip and the substrate;
   while maintaining said seal, applying uniform pressure to the assembly causing the encapsulant to flow between the chip and the substrate; and
   applying energy to the assembly in order to cure the encapsulant.

24. The method as claimed in claim 23, wherein the uniform pressure is isostatic gas pressure.

25. The method as claimed in claim 23, wherein the uniform pressure is hydrostatic fluid pressure.

26. The method as claimed in claim 23, wherein the step of applying pressure forces the fluid encapsulant through channels and into cavities in the gap.

27. The method as claimed in claim 23, further comprising the step of electrically and mechanically connecting a plurality of contact pads on the face surface of the chip to corresponding bond pads on the substrate prior to the application of energy.

28. The method as claimed in claim 23, wherein the step of applying pressure compresses a first gas sealed in the void thereby reducing the volume of the void.

29. The method as claimed in claim 28, wherein the step of applying pressure creates a higher pressure first gas in the void relative to an ambient gas outside of the encapsulant thereby causing the first gas to exit from the void.

30. The method as claimed in claim 28, wherein the rate of diffusion of the first gas into the encapsulant is greater than the rate of diffusion of the ambient gas into the encapsulant.

31. The method as claimed in claim 30, wherein the first gas and the ambient gas are comprised of the same gas.

32. The method as claimed in claim 30, further comprising the step of removing the first gas from around the assembly and replacing it with the ambient gas after the sealing step.

33. The method as claimed in claim 32, wherein the encapsulant is comprised of a material which retards the diffusion of the ambient gas.

34. The method as claimed in claim 32, wherein the first gas is selected from the group consisting of helium, hydrogen, water vapor, fluorinated hydrocarbons and methane.

35. The method as claimed in claim 34, wherein the second gas is selected from the group consisting of argon, air, nitrogen, and carbon dioxide.

36. The method as claimed in claim 23, further comprising the step of evacuating gas from around the chip and substrate prior to the sealing step.

37. The method as claimed in claim 36, wherein the step of applying pressure reduces the volume of the void.

38. The method as claimed in claim 37, wherein the encapsulant is comprised of a material which retards the diffusion of the ambient gas.

39. The method as claimed in claim 23, wherein the applied pressure is between about 10 and 300 pounds per square inch.

40. The method as claimed in claim 23, wherein the step of applying energy includes applying heat.

41. The method as claimed in claim 23, wherein the encapsulant is comprised of a flowable thermoset resin.

42. The method as claimed in claim 41, wherein the uncured encapsulant is selected from the group consisting of silicone, flexiblized epoxy, urethane resin and thermoplastic resin.

43. The method as claimed in claim 23, wherein the step of providing a gap includes providing supports between the chip and the substrate.

44. The method as claimed in claim 23, wherein the substrate is flexible.

45. The method as claimed in claim 44, wherein the substrate is comprised of polyimide.

46. A method of treating an interposer layer for a semiconductor package assembly to provide a void free interposer layer, comprising the steps of:
 disposing a sheet-like, compliant interposer layer between a face surface of a semiconductor chip and a first surface of a substrate such that any voids within or at the boundaries of the interposer are sealed within the assembly;
 while maintaining said seal, applying uniform pressure to the assembly wherein any voids in the interposer layer are substantially eliminated.

47. The method as claimed in claim 46, wherein the uniform pressure is isostatic gas pressure.

48. The method as claimed in claim 46, wherein the uniform pressure is hydrostatic fluid pressure.

49. The method as claimed in claim 46, wherein the interposer layer is comprised of a cured, sheet-like first layer and an at least partially uncured second layer.

50. The method as claimed in claim 49, wherein the disposing step includes the steps of providing an attached first layer on the first surface of the substrate, providing the second layer on top of the first layer, and positioning and attaching the first surface of the chip on an exposed surface of the second layer.

51. The method as claimed in claim 50, further comprising the step of applying energy to the assembly in order to at least partially cure the second layer.

52. The method as claimed in claim 51, wherein the step of applying energy occurs during the step of applying pressure.

53. The method as claimed in claim 52, wherein the energy is comprised of heat.

54. The method as claimed in claim 46, wherein the step of applying pressure compresses a first gas within at least one void in the interposer thereby reducing the volume of the void.

55. The method as claimed in claim 54, wherein the step of applying pressure creates a higher pressure first gas in the void relative to an ambient gas outside of the encapsulant thereby causing the gas to exit from the void.

56. The method as claimed in claim 50, wherein during the rate of diffusion of the first gas into the second layer is greater than the rate of diffusion of the ambient gas into the second layer.

57. The method as claimed in claim 56, wherein the first gas and the ambient gas are the same gas.

58. The method as claimed in claim 56, further comprising the step of removing the first gas from around the assembly and replacing it with the ambient gas after the sealing step.

59. The method as claimed in claim 58, wherein the second layer is comprised of a material which retards the diffusion of the ambient gas.

60. The method as claimed in claim 58, wherein the first gas is selected from the group consisting of helium, hydrogen, water vapor, fluorinated hydrocarbons and methane.

61. The method as claimed in claim 60, wherein the second gas is selected from the group consisting of argon, air, nitrogen, and carbon dioxide.

62. The method as claimed in claim 46, further comprising the step of evacuating gas from around the chip and substrate prior to the sealing step.

63. The method as claimed in claim 62, wherein the step of applying pressure reduces the volume of the void.

64. The method as claimed in claim 63, wherein the encapsulant is comprised of a material which retards the diffusion of the ambient gas.

65. The method as claimed in claim 46, wherein the applied pressure is between about 10 and 300 pounds per square inch.

66. The method as claimed in claim 46, wherein the first layer of the interposer layer is selected from the group consisting of silicone, flexiblized epoxy, urethane resin, polyimide foam, pressure sensitive adhesive and thermoplastic resin.

67. The method as claimed in claim 66, wherein the uncured second layer of the interposer layer is selected from the group consisting of silicone, flexiblized epoxy, urethane resin, polyimide foam, pressure sensitive adhesive and thermoplastic resin.

68. The method as claimed in claim 46, wherein the substrate is flexible.

69. A method of creating a void-free interposer layer for a microelectronic component, comprising the steps of:
 injecting an interposer layer into a gap between a microelectronic component and a sheet-like substrate such that any voids within or at the boundaries of the interposer are sealed within the gap;
 while maintaining said seal, applying uniform pressure to the assembly wherein any voids in the interposer layer are substantially eliminated.

70. The method as claimed in claim 69, wherein the uniform pressure is isostatic gas pressure.

71. The method as claimed in claim 69, wherein the uniform pressure is hydrostatic fluid pressure.

72. The method as claimed in claim 69, wherein the injecting step includes the steps of dispensing an encapsulant at the edges of the gap so that the encapsulant seals the gap, wherein the step of applying pressure causes the encapsulant to flow into the gap and form a substantially void free interposer layer.

73. The method as claimed in claim 72, further comprising the step of applying energy to the encapsulant after the voids have been substantially removed in order to cure the encapsulant.

74. The method as claimed in claim 73, wherein the step of applying energy occurs during the step of applying pressure.

75. The method as claimed in claim 74, wherein the energy is comprised of heat.

76. The method as claimed in claim 69, wherein the step of applying pressure compresses a first gas within a void in the interposer thereby reducing the volume of the void.

77. The method as claimed in claim 76, wherein the step of applying pressure creates a higher pressure first gas in the void relative to an ambient gas outside of the encapsulant thereby causing the gas to exit from the void.

78. The method as claimed in claim 77, wherein during the rate of diffusion of the first gas into the encapsulant is greater than the rate of diffusion of the ambient gas into the encapsulant.

79. The method as claimed in claim 78, wherein the first gas and the ambient gas are the same gas.

80. The method as claimed in claim 78, further comprising the step of removing the first gas from around the assembly and replacing it with the ambient gas after the sealing step.

81. The method as claimed in claim 80, wherein the encapsulant is comprised of a material which retards the diffusion of the ambient gas.

82. The method as claimed in claim 80, wherein the first gas is selected from the group consisting of helium, hydrogen, water vapor, fluorinated hydrocarbons and methane.

83. The method as claimed in claim 82, wherein the second gas is selected from the group consisting of argon, air, nitrogen, and carbon dioxide.

84. The method as claimed in claim 69, further comprising the step of evacuating gas from around the microelectronic device and substrate prior to the injecting step.

85. The method as claimed in claim 84, wherein the step of applying pressure reduces the volume of the void.

86. The method as claimed in claim 85, wherein the encapsulant is comprised of a material which retards the diffusion of the ambient gas.

87. The method as claimed in claim 69, wherein the applied pressure is between about 10 and 300 pounds per square inch.

88. The method as claimed in claim 87, wherein the encapsulant is selected from the group consisting of silicone, flexiblized epoxy, urethane resin, polyimide foam and thermoplastic resin.

89. The method as claimed in claim 69, wherein the substrate is flexible.

90. The method as claimed in claim 69, wherein the substrate is comprised of polyimide.

91. The method as claimed in claim 69, wherein the microelectronic device is comprised of a semiconductor chip.

92. The method as claimed in claim 69, wherein the microelectronic device is comprised of a heat spreader.

93. The method as claimed in claim 69, wherein the microelectronic device is comprised of a support ring encircling a semiconductor chip.

* * * * *

UNITED STATES PATENT AND TRADEMARK OFFICE
CERTIFICATE OF CORRECTION

PATENT NO. : 5,834,339
DATED : November 10, 1998
INVENTOR(S) : DiStefano et al.

It is certified that error appears in the above-identified patent and that said Letters Patent is hereby corrected as shown below:

Column 2, line 7, delete "the".

Column 4, line 11, "void/bubble" should read --voids/bubbles--.

Column 4, line 64, delete "the".

Column 4, line 65, "show" should read -- shown--.

Column 4, line 65, delete "are".

Column 5, line 1, "21" should read --2I--.

Column 9, line 66, "21" should read --2I--.

Column 10, line 62, "21" should read --2I--.

Column 11, line 28, delete "in".

Column 11, line 30, "shows" should read --show--.

Column 11, line 32, "21" should read --2I--.

Column 11, line 36, "detachably held" should read --detachably be held--.

Column 11, line 43, "layer, is" should read --layer, and is--.

UNITED STATES PATENT AND TRADEMARK OFFICE
CERTIFICATE OF CORRECTION

PATENT NO. : 5,834,339
DATED : November 10, 1998
INVENTOR(S) : DiStefano et al.

It is certified that error appears in the above-identified patent and that said Letters Patent is hereby corrected as shown below:

Column 13, line 57, delete "be".

Column 13, line 61, delete "the".

Column 14, line 43, "applied the" should read --applied to the--.

Column 17, line 55, delete "during".

Column 18, line 64, delete "during".

Signed and Sealed this

Fourth Day of May, 1999

*Attest:*

*Attesting Officer*

Q. TODD DICKINSON

*Acting Commissioner of Patents and Trademarks*